(12) United States Patent
Shi

(10) Patent No.: US 9,437,511 B2
(45) Date of Patent: Sep. 6, 2016

(54) METHOD AND STRUCTURE FOR WAFER-LEVEL PACKAGING

(71) Applicant: NANTONG FUJITSU MICROELECTRONICS CO., LTD., Nantong (CN)

(72) Inventor: Jiangen Shi, Nantong (CN)

(73) Assignee: NANTONG FUJITSU MICROELECTRONICS CO., LTD., Nantong (CN)

( * ) Notice: Subject to any disclaimer, the term of this patent is extended or adjusted under 35 U.S.C. 154(b) by 0 days.

(21) Appl. No.: 14/964,869

(22) Filed: Dec. 10, 2015

(65) Prior Publication Data

US 2016/0172263 A1    Jun. 16, 2016

(30) Foreign Application Priority Data

Dec. 11, 2014 (CN) .......................... 2014 1 0762885

(51) Int. Cl.

| H01L 23/544 | (2006.01) |
| --- | --- |
| H01L 23/31 | (2006.01) |
| H01L 21/82 | (2006.01) |
| H01L 21/56 | (2006.01) |
| H01L 21/768 | (2006.01) |
| H01L 23/00 | (2006.01) |
| H01L 23/532 | (2006.01) |

(52) U.S. Cl.
CPC ......... *H01L 23/3114* (2013.01); *H01L 21/563* (2013.01); *H01L 21/76885* (2013.01); *H01L 21/82* (2013.01); *H01L 23/3107* (2013.01); *H01L 23/53228* (2013.01); *H01L 24/11* (2013.01); *H01L 24/13* (2013.01)

(58) Field of Classification Search
CPC ........... H01L 23/3114; H01L 23/3107; H01L 23/53228; H01L 24/11; H01L 24/13; H01L 21/563; H01L 21/76885; H01L 21/82
USPC ......................................... 257/620
See application file for complete search history.

(56) References Cited

U.S. PATENT DOCUMENTS 8,500,344 B2 * 8/2013 Zung ................. H01L 27/14618
348/340

\* cited by examiner

*Primary Examiner* — Tu-Tu Ho
(74) *Attorney, Agent, or Firm* — Anova Law Group, PLLC

(57) ABSTRACT

A method for wafer-level packaging includes providing a semiconductor wafer having a plurality of semiconductor chips connected by connection stems in the wafer. The method further includes forming a plurality of through holes in the connections stems; forming a protective layer covering the wafer with a plurality of positions for planting soldering balls exposed. The protective layer includes an upper protective layer formed on a top side of the wafer, a lower protective layer formed on a back side of the wafer, and a plurality of middle protective layers formed in the through holes. The upper protective layer is connected to the lower protective layer through the plurality of the middle protective layers. The method also includes forming soldering balls on the positions for planting soldering balls and finally, forming a plurality of packaged individual semiconductor chip structures by cutting the wafer along the connection stems with the through holes.

19 Claims, 4 Drawing Sheets

US 9,437,511 B2

METHOD AND STRUCTURE FOR WAFER-LEVEL PACKAGING

CROSS-REFERENCES TO RELATED APPLICATIONS

This application claims the priority of Chinese patent application No. 201410762885.9, filed on Dec. 11, 2014, the entirety of which is incorporated herein by reference.

FIELD OF THE INVENTION

The present invention generally relates to the field of semiconductor manufacturing technology and, more particularly, relates to a method and a structure for wafer-level packaging.

BACKGROUND

Helped by reduction of cost and improvement of front-end wafer fabrication process, development of semiconductor devices has met the goal of reducing size of single chips of semiconductor devices while keeping same functions for the chips. Specifically, soldering balls may be formed on semiconductor wafers and then be directly applied to printed circuits.

Due to limitations of semiconductor wafer fabrication process or because of considerations by designers on multiple applications of a single integrated circuit, the positions of soldering balls of input and output terminals for electrical signal transmission need to be redefined during a semiconductor wafer-level packaging process.

FIG. 1 shows a schematic view of the structure of an exemplary semiconductor wafer with positions of soldering balls redefined using a method of the current technology. Referring to FIG. 1, after forming electric circuits on an active surface of a semiconductor wafer 101', a plurality of electrodes 102' and first passivation layers 103' are formed on the surface of the semiconductor wafer 101'. The semiconductor wafer 101' further includes a plurality of semiconductor chips 100'. The plurality of the semiconductor chips 100' are connected with each other by scribe grooves 104a'. A second passivation layer 110' is formed on each first passivation layer 103' and an opening is formed in the second passivation layer 110' near a corresponding electrode 102'. A re-distribution metal layer 210' is formed on the surface of each second passivation layer 110'. Further, a third passivation layer 310' is formed on the surface of each re-distribution metal layer 210', and an opening is formed on the third passivation layer 310' to expose the surface of the re-distribution metal layer 210'. An under bump metal layer 410' is then formed to cover the bottom surface and the sidewall surface of the opening in each third passivation layer 310'. The under bump metal layer 410' also covers a portion of the top surface of the third passivation layer near the opening. A spherical bump 510' is then formed on the under bump metal layer 410' by a pre-planting and backflow method. Further, a layer of adhesive film is attached on the back surface of the semiconductor wafer 101' and the adhesive film layer is then cured. Finally, wafer-level packaged individual components 100' are fully encapsulated after cutting.

However, the above method may cause interlayer separation between the bottom surface of the third passivation layer 310' and the top surface of the re-distribution metal layer 210' and, thus, may lead to subsequent failure of electrical performance of the product. The disclosed method and structure for wafer-level packaging is directed to solve one or more problems set forth above and other problems.

BRIEF SUMMARY OF THE DISCLOSURE

One aspect of the present disclosure provides a method for wafer-level packaging. Specifically, the method includes providing a semiconductor wafer having a plurality of semiconductor chips and connection stems. The connection stems are under scribe grooves of the wafer between semiconductor chips. The method further includes forming a plurality of through holes in the connections stems; forming a protective layer covering the wafer with a plurality of positions for planting soldering balls exposed. The protective layer includes an upper protective layer formed on a top side of the wafer, a lower protective layer formed on a back side of the wafer, and a plurality of middle protective layers formed in the through holes. The upper protective layer is connected to the lower protective layer through the plurality of the middle protective layers. The method also includes forming soldering balls on the positions for planting soldering balls and finally, forming a plurality of packaged individual semiconductor chip structures by cutting the wafer along the connection stems with the through holes.

Another aspect of the present disclosure provides a packaged semiconductor wafer. The semiconductor wafer includes a plurality of semiconductor chips and connection stems with the connection stems located under scribe grooves of the wafer between semiconductor chips, a plurality of through holes formed in the connection stems, a plurality of copper pillars formed on the wafer, a plurality of soldering balls planted on top surfaces of the plurality of copper pillars, and a protective layer covering the wafer with the soldering ball exposed. The protective layer includes an upper protective layer formed on a top side of the wafer, a lower protective layer formed on a back side of the wafer, and a plurality of middle protective layers formed in the through holes. The upper protective layer is connected to the lower protective layer through the plurality of the middle protective layers.

Another aspect of the present disclosure provides a packaged semiconductor chip structure cutting from the packaged semiconductor wafer described above. The packaged semiconductor chip structure includes an electrode, a passivation layer formed on the semiconductor chip and on the electrode with an opening exposing a portion of the electrode, a distribution metal layer formed on the passivation layer and electrically contacted with the electrode in the opening formed in the passivation layer, a copper pillar formed on the distribution metal layer, a soldering ball planted on a top surface of the copper pillar, and a protective layer covering the above components with the soldering ball exposed. The protective layer includes an upper protective layer formed on a top side of the wafer, a lower protective layer formed on a back side of the wafer, and a plurality of middle protective layers covering a portion of the edges of the semiconductor chip structure. Further, the upper protective layer is connected to the lower protective layer through the plurality of the middle protective layers.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
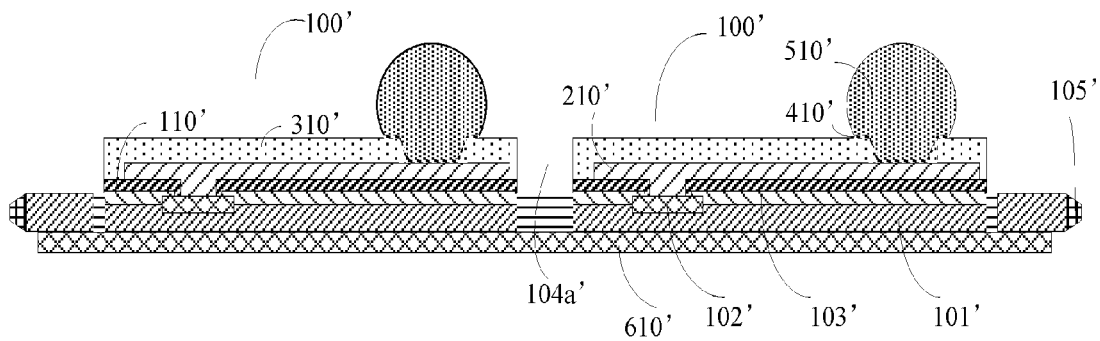
FIG. 1 illustrates a schematic cross-section view of the structure of an exemplary semiconductor wafer in current technology.
Figure 2:
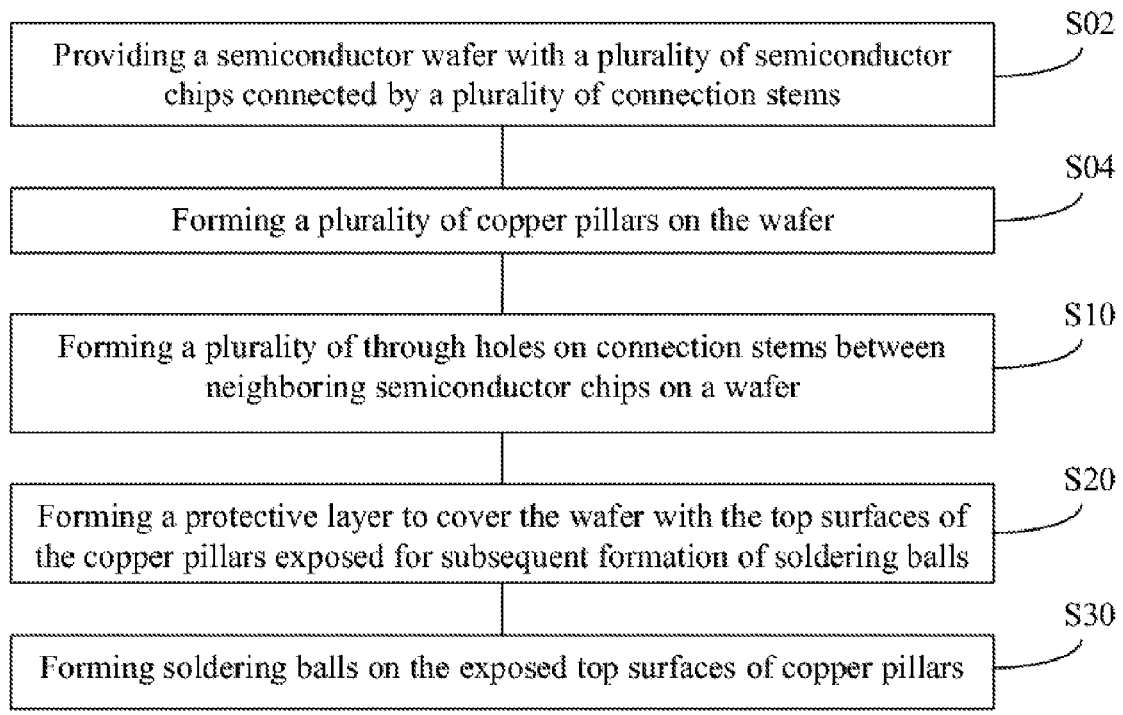
FIG. 2 illustrates a flowchart of a wafer-level packaging process consistent with disclosed embodiments.

FIG. 2 shows a flowchart of a method for wafer-level packaging consistent with disclosed embodiments. FIGS. 4-8 illustrates schematic cross-section views of semiconductor structures corresponding to certain stages of the fabrication process.

Wafer-level packaging, as used herein, may refer to packaging integrated circuits (ICs) before dividing a wafer into a number of semiconductor chips with each chip containing an independent IC, that is, packaging ICs at the wafer level. For example, the current wafer-level packaging technology includes a variety of methods such as wafer-level chip scale packaging (WLCSP), fan-out wafer level packaging (FOWLP), etc.

Figure 4:
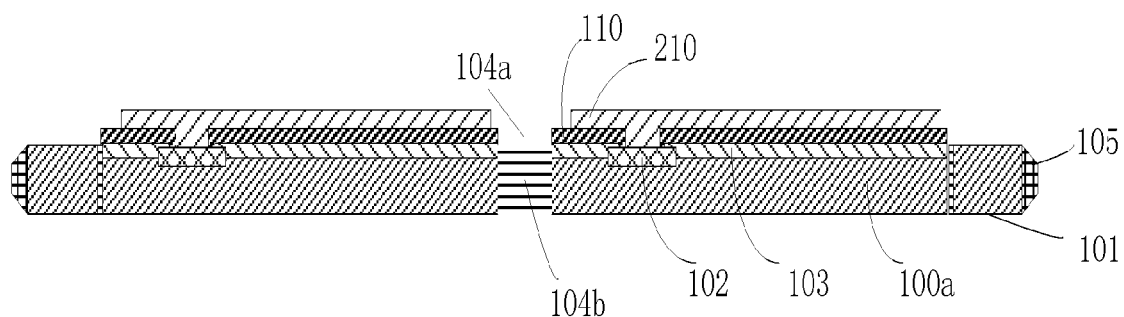
FIGS. 4-8 illustrates schematic cross-section views of semiconductor structures corresponding to certain stages of the fabrication process consistent with disclosed embodiments.

As shown in FIG. 2, at the beginning of the wafer-level packaging process, a semiconductor wafer is provided (S02). FIG. 4 illustrates an exemplary semiconductor wafer 101 consistent with the disclosed embodiments.

Referring to FIG. 4, a plurality of semiconductor chips 100a with complete electric circuits may be formed on an active surface of the semiconductor wafer 101. The plurality of the semiconductor chips 100a may be connected with each other by connection stems 104b under scribe grooves 104a. A plurality of electrodes 102 and a plurality of first passivation layers 103 may be formed on the surface of the semiconductor wafer 101. An opening may be formed in each of the first passivation layers 103 to expose a corresponding electrode 102.

A second passivation layer 110 with an opening may be formed on the surface of each first passivation layer 103. The opening in the second passivation layer 110 may be located on the top of the corresponding electrode 102 to expose the surface of the electrode 102. A distribution metal layer 210 may be formed on each of the second passivation layer 110 to electrically connect to the corresponding electrode 102 inside the openings in the second passivation layer 110 and in the first passivation layer 103.

The connection stems 104b are the connection parts between neighboring semiconductor chips 100a and are located under the scribe grooves 104a between neighboring semiconductor chips 100a. The scribe grooves 104a are pre-defined in the wafer with a certain depth so that the scribe grooves 104a not only divide the whole wafer into a plurality of semiconductor chip but also make the cutting process easier after the completion of the wafer-level packaging. Conventionally, the depth of the scribe grooves 104a is uniform and the connection stems 104b underneath of the scribe grooves 104a are solid parts of the initial wafer 101 without holes running from the top surface of the wafer to the back surface of the wafer. Therefore, the protective layer formed during the wafer-level packaging process may either only cover one side of the semiconductor chip or be separated to two non-connected protective layers with one covering the top side of the chip while and other covering the back side of the chip after the wafer is divided into individual chips. In either situation, the protective may be easily stripped off from the semiconductor chip structure, leading to subsequent failure of electrical performance of the product.

In one embodiment, the distribution metal layer 210 is formed on a second passivation layer 110 and the second passivation layer 110 is formed on the first passivation layer 103. In another embodiment, the distribution metal layer 210 is formed directly on the surface of the first passivation layer 103 without any extra second passivation layer formed between the first passivation layer 103 and the distribution metal layer 210. Accordingly, the distribution metal layer 210 is electrically connected to the electrode 102 in the opening formed in the first passivation layer 103.

Figure 5:
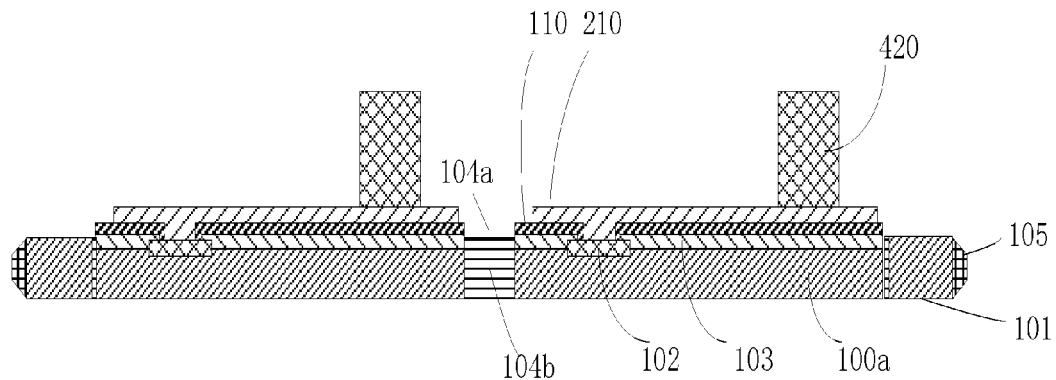

Further, returning to FIG. 2, a plurality of copper pillars may be formed on the wafer 101 (S04). FIG. 5 shows a corresponding structure of the semiconductor wafer and the semiconductor chips. As shown in FIG. 5, a plurality of copper pillars 420 may be formed on the distribution metal layers 210 of the semiconductor wafer 101 and the semiconductor chips 100a to electrically connect to the distribution metal layers 210. In a subsequent process, soldering balls may be further planted on the top surfaces of the copper pillars 420.

Figure 6A:
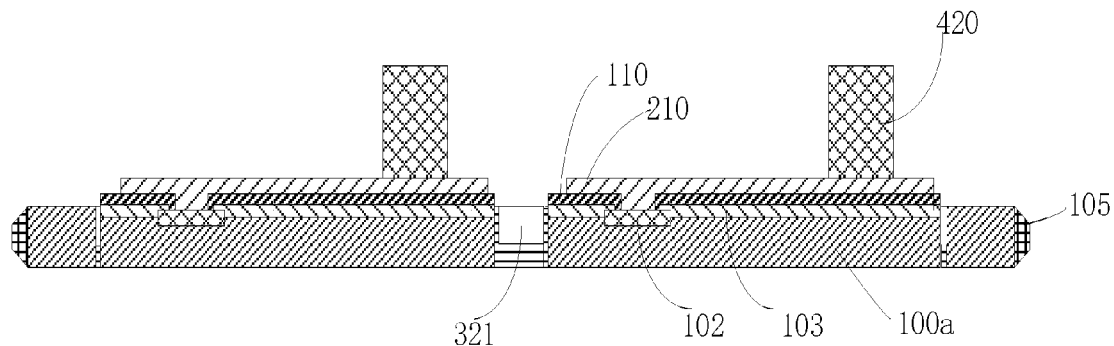
Figure 6B:
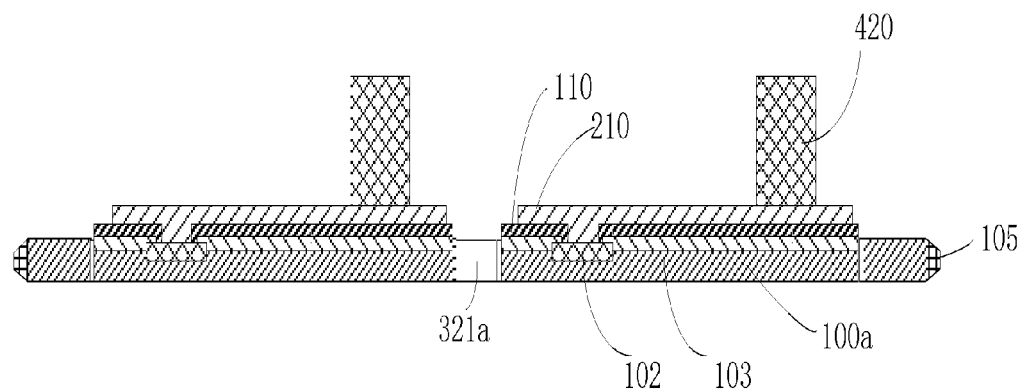

Returning back to FIG. 2, further, a through hole may be formed in each connection stem (S10). FIG. 6b shows a corresponding structure with a through hole 321 formed in a connection stem 104b. That is, a plurality of through holes may be formed on connection stems between the neighboring semiconductor chips on the wafer 101.

In one embodiment, the through hole 321a is formed by directly penetrating a connection stem 104b. In another embodiment, the through hole 321a is formed by a two-step process: first, referring to FIG. 6a, a blind hole 321 with a pre-defined depth is formed in the connection stem 104b from the bottom of the corresponding scribe groove (no shown); then, referring to FIG. 6b, a through hole 321a is formed from the blind hole 321 by performing a polishing process on the back side (non-active surface side) of the semiconductor chips and the connection stem.

The dimension of the through hole 321a may be smaller than or equal to the dimension of the connection stem 104b. In one embodiment, the dimension of the through hole 321a is smaller than the dimension of the connection stem 104b. As a consequence, after breaking the connection stem 104b to form an individual semiconductor chip structure, a connection stem residue 104c may remain in the semiconductor chip structure. In certain other embodiments, the dimension of the through hole 321a may be the same as the dimension of the connection stem 104b, and as a result, the subsequently-formed semiconductor chip structure may not contain any connection stem residue 104c.

Figure 7:
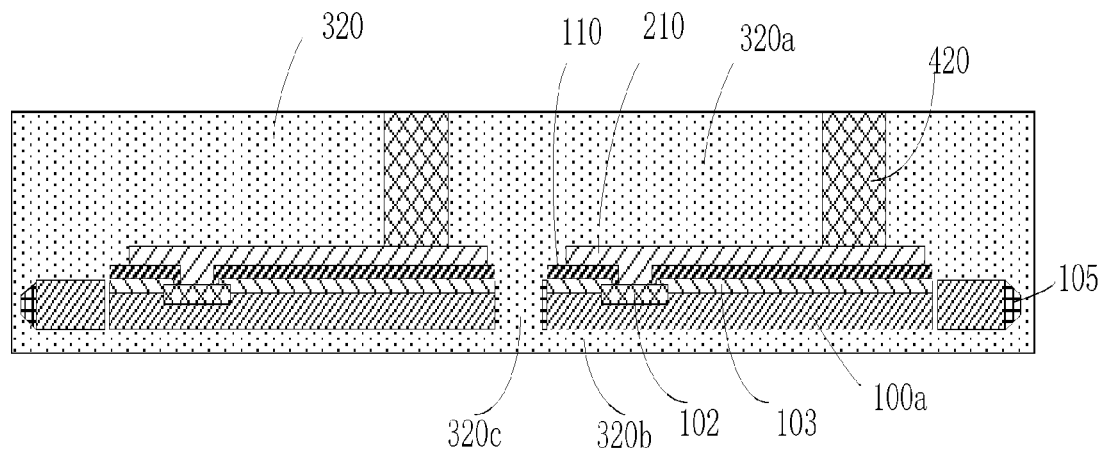

Further, returning to FIG. 2, a protective layer 320 may be formed to wrap up the semiconductor wafer and the above-mentioned components with the top surfaces of the copper pillars 420 exposed (S20). FIG. 7 shows a corresponding structure after the formation of the protective layer 320.

The protective layer 320 may include an upper protective layer 320a formed on the front surface (active side) of the semiconductor wafer 101, a lower protective layer 320b formed on the back surface (non-active side) of the semiconductor wafer 101, and a plurality of middle protective layers 320c formed in the through holes 321a. The upper protective layer 320a is connected to the lower protective layer 320b through the plurality of the middle protective layers 320c.

The protective layer 320 may be made of a resin material. Using resin as the material for the protective layer may not only reduce the cost, but also form a fully encapsulated structure, thus providing desired protection against device damages caused by external environment such as humidity and static electricity. In the meantime, when using a single material for packaging, the thermal expansion coefficient remains uniform and, thus, warping due to stress releasing may be avoided.

The protective layer 320 may be formed by a process including: first, softening a protective material; then, letting the softened protective material flow from one side of the wafer to the opposite side of the wafer through the through holes to wrap up the wafer.

The exposure of the top surfaces of the copper pillars 420 may be ensured by a pre-defined height of the copper pillars 420 or by any appropriate process to subsequently remove the protective material formed on the top surfaces of the copper pillars 420 after forming the protective layer described above.

Figure 8:
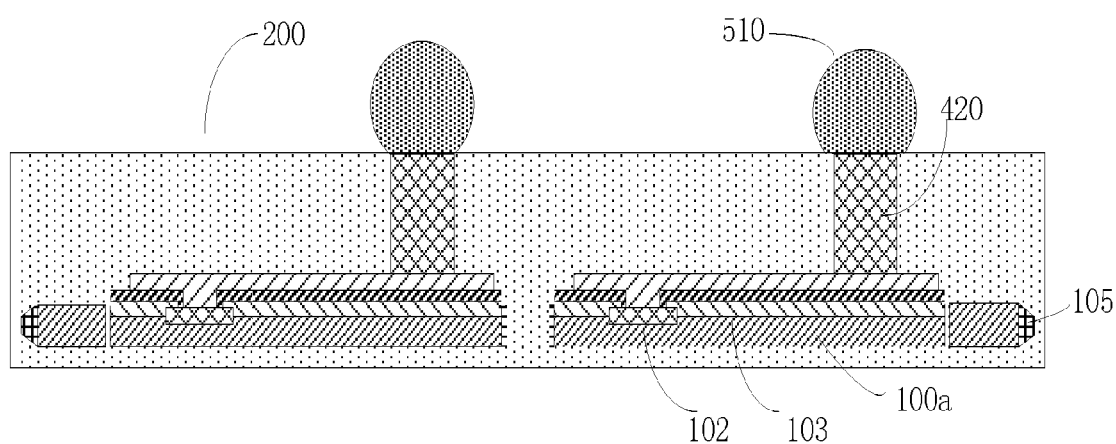

Further, returning to FIG. 2, soldering balls may be planted on the exposed top surfaces of the copper pillars (S30). FIG. 8 shows a corresponding structure after soldering balls 510 are planted on the top surfaces of the copper pillars 420.

Referring to FIG. 8, the top surfaces of the copper pillars 420 are defined as positions for planting soldering balls. Soldering balls 510 are formed on the exposed top surfaces of the copper pillars 420.

The soldering balls 510 may be formed by any appropriate method. For example, the soldering balls 510 may be formed by a pre-planting and backflow method.

Figure 3:
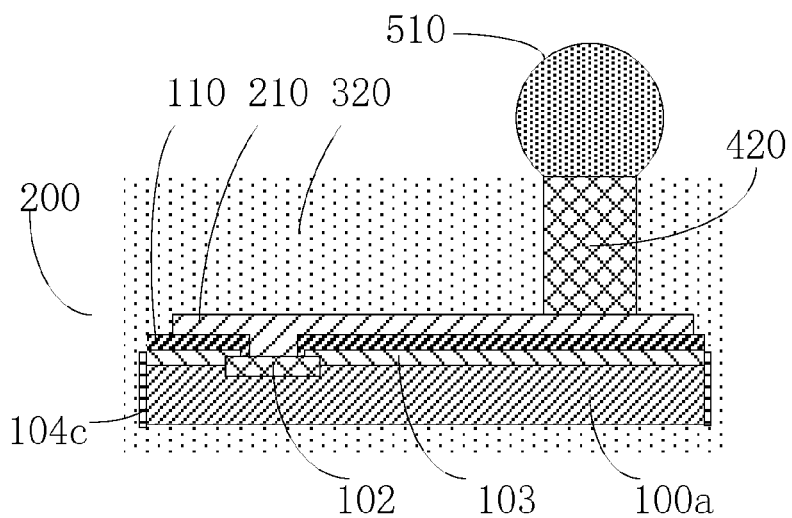
FIG. 3 illustrates a schematic cross-section view of a semiconductor chip in an exemplary semiconductor wafer-level packaging structure consistent with disclosed embodiments.

Of course, after planting the soldering balls 510, the connection stems 104b may be cut off to further form individual semiconductor chip structures 200 based on the plurality of semiconductor chips on the wafer. FIG. 3 shows a schematic cross-section view of an exemplary semiconductor chip structure packaged by a wafer-level packaging method consistent with disclosed embodiments. Referring to FIG. 3, a semiconductor chip structures 200 is completed after cutting the packaged wafer.

Simultaneously with separation of the semiconductor chips by cutting the connection stems 104b, the protective material, such as in the middle protective layers 320c, may also be cut into two halves with the halves belonging to two distinct semiconductor chips 200.

The present disclosure also includes a semiconductor structure containing a plurality of semiconductor chip structures 200. Referring to FIG. 3, the semiconductor chip structure 200 includes a semiconductor chip 100a, an electrode 102, and a first passivation layer 103. An opening is formed in the first passivation layer 103 to expose the surface of the electrode 102. The semiconductor chip structure 200 also includes a second passivation layer 110 formed on the first passivation layer and a distribution metal layer 210 formed on the second passivation layer 110.

An opening is formed in the second passivation layer 110 and the opening in the second passivation layer 110 is located above the opening in the first passivation layer 103. The distribution metal layer 210 is electrically connected with the electrode 102 through the openings of the first passivation layer 103 and the second passivation layer 110. The semiconductor chip structure 200 further includes a plurality of copper pillars 420 formed on the distribution metal layer 210 and a plurality of soldering balls 510 formed on the top of copper pillars 420. Finally, the semiconductor chip structure 200 includes a protective layer 320 wrapping up the structure formed by the wafer 101, the electrode 102, the first passivation layer 103, the distribution metal layer 210, and the copper pillars 420, and also a plurality of soldering balls to cover the top surfaces of the copper pillars 420.

In one embodiment, a second passivation layer 110 with an opening may not be formed. That is, the distribution metal layer 210 is directly formed on the top of the first passivation layer 103. Thus, the distribution metal layer 210 is electrically connected to the electrode 102 in the opening of the first passivation layer 103.

Each semiconductor chip structure 200 is formed on a single semiconductor chip 100a and includes an independent set of the above mentioned structures, such as the electrode 102, the first passivation layer 103, the second passivation layer 110, the distribution metal layer 210, the copper pillar 420, the soldering ball 510, etc. During the packaging process, a semiconductor wafer 101 may be divided into a plurality of such semiconductor chips 100a. Thus, a plurality of semiconductor chip structures 200 may be simultaneously formed on the wafer 101. The plurality of semiconductor chips 100a are connected with each other by connection stems 104b and together form the semiconductor wafer 101. Further, after the completion of the wafer level packaging process, the connection stems may be broken to form individual semiconductor chips.

Referring to FIGS. 4-8, among the semiconductor chips that form the semiconductor wafer, the outer most chips may have an edge part 105. The edge part 105 may not be connected to another chip. In addition, FIGS. 4-8 only show two complete semiconductor chips with corresponding structures and a connection stem between the two semiconductor chips. However, the number of the semiconductor chips formed on the wafer is not limited to two. For clarity, other semiconductor chips are schematically simplified in FIGS. 4-8. The structures of the simplified semiconductor chips should be identical to the structures of the two representative chips illustrated in the figures.

In addition, other connection stems between neighboring chips are also schematically simplified in the figures and the structure of the simplified connection stems are also the same as the structure of the connection stem shown in the figures. Through holes or blind holes formed in the connection stems may also have a dimension smaller than or equal to the dimension of the connection stems. When the dimension of the hole is smaller than the dimension of the corresponding connection stem, a connection stem residue may be exist in the subsequently-formed individual semiconductor chip structure while when the dimension of the hole equals to the dimension of the corresponding connection stem, the subsequently-formed individual semiconductor chip structure may not contain a connection stem residue.

Because the semiconductor wafer 101 includes the plurality of semiconductor chips 100a and the connection stems 104b, the fabrication process described above on the semiconductor wafer 101 is conducted on each individual semiconductor chip 104. In general, the semiconductor wafer should be considered as a collection of the plurality of the semiconductor chips and the connection stems. For example, performing a polishing process on the back surface of the semiconductor wafer described above is equivalent to performing a polishing process on the back surfaces of the semiconductor chips and the back surfaces of the connection stems.

The disclosed wafer-level packaging method may demonstrate following advantages: First, a third passivation layer usually used in methods of the current technology is not required in the disclosed method, thus separation between the bottom of the third passivation layer and the wafer may be avoided; Second, the middle protective layers connect with both the upper protective layer and the lower protective layer, thus separation between the protective layer and the wafer may also be avoided. Therefore, adopting the disclosed wafer-level packaging method in semiconductor manufacture may improve the product yield.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for wafer-level packaging, comprising:
   providing a semiconductor wafer having a plurality of semiconductor chips and connection stems, wherein the connection stems are under scribe grooves of the wafer between semiconductor chips;
   forming a plurality of through holes in the connection stems;
   forming a protective layer covering the wafer and exposing positions for planting soldering balls;
   forming soldering balls on the positions for planting soldering balls; and
   forming a plurality of packaged individual semiconductor chip structures by cutting the wafer along the connection stems with the through holes, wherein:
      the protective layer includes an upper protective layer formed on a top side of the wafer, a lower protective layer formed on a back side of the wafer, and a plurality of middle protective layers formed in the through holes; and
      the upper protective layer is connected to the lower protective layer through the plurality of the middle protective layers.

2. The method according to claim 1, wherein forming the protective layer further includes:
   providing a softened protective material; and
   flowing the softened protective material from one side of the wafer to an opposite side of the wafer through the through holes to cover the wafer.

3. The method according to claim 2, wherein the protective layer is made of a resin material.

4. The method according to claim 1, wherein each semiconductor chip on the wafer includes:
   an electrode;
   a passivation layer formed on the electrode and on the semiconductor chip with an opening exposing a portion of the electrode; and
   a distribution metal layer formed on the passivation layer and electrically connecting to the electrode in the opening formed in the passivation layer.

5. The method according to claim 4, wherein each semiconductor chip on the wafer further includes a copper pillar formed on the distribution metal layer and a top surface of the copper pillar defines a corresponding position for planting soldering balls.

6. The method according to claim 4, wherein:
   the passivation layer has a single layer structure including a first passivation layer; and
   the opening is formed in the first passivation layer.

7. The method according to claim 4, wherein:
   the passivation layer has a double layer structure including a first passivation layer and a second passivation layer with the second passivation layer formed on the first passivation layer;
   the opening is formed by a first opening in the first passivation layer and a second opening in the second passivation layer; and
   the second opening formed in the second passivation layer is on the top of the first opening formed in the first passivation layer.

8. The method according to claim 1, wherein the through holes are formed by directly penetrating through the corresponding connection stems.

9. The method according to claim 1, wherein forming the through holes further includes:
   forming blind holes with a pre-defined depth from a front side of the corresponding connection stems; and
   polishing the wafer from the back side until the blind holes form through holes.

10. The method according to claim 1, wherein forming a plurality of packaged individual chip structures by cutting the wafer along the connection stems further includes cutting the protective layer along the connection stems.

11. A packaged semiconductor wafer, comprising:
    a plurality of semiconductor chips and connection stems with the connection stems located under scribe grooves of the wafer between semiconductor chips;
    a plurality of through holes formed in the connection stems;
    a plurality of copper pillars formed on the wafer;
    a plurality of soldering balls planted on top surfaces of the plurality of copper pillars; and
    a protective layer covering the wafer with the soldering ball exposed; wherein:
    the connection stems are connection parts in the wafer under a plurality of scribe grooves pre-defined between the plurality of semiconductor chips;
    the protective layer includes an upper protective layer formed on a top side of the wafer, a lower protective layer formed on a back side of the wafer, and a plurality of middle protective layers formed in the plurality of through holes penetrating the connection stems; and
    the upper protective layer is connected to the lower protective layer through the plurality of the middle protective layers.

12. The packaged semiconductor wafer according to claim 11, wherein each semiconductor chip further includes:
    an electrode formed on a top surface of the semiconductor wafer;
    a passivation layer formed on the semiconductor chip and on the electrode with an opening exposing a portion of the electrode;
    a re-distribution metal layer formed on the passivation layer and electrically connecting to the electrode in the opening formed in the passivation layer; wherein:
    the re-distribution layer is electrically contacted with the copper pillar formed on the re-distribution layer.

13. The packaged semiconductor wafer according to claim 11, wherein:

the passivation layer has a single layer structure including a first passivation layer; and the opening is formed in the first passivation layer.

14. The packaged semiconductor wafer according to claim 11, wherein:

the passivation layer has a double layer structure including a first passivation layer and a second passivation layer with the second passivation layer formed on the first passivation layer;

the opening is formed by an opening in the first passivation layer and an opening in the second passivation layer; and the opening formed in the second passivation layer is on the top of the opening formed in the first passivation layer.

15. A packaged semiconductor chip structure cutting from the packaged semiconductor wafer according to claim 11, comprising:

an electrode formed on a top surface of the semiconductor chip;

a passivation layer formed on the semiconductor chip and on the electrode with an opening exposing a portion of the electrode;

a distribution metal layer formed on the passivation layer and electrically contacted with the electrode in the opening formed in the passivation layer;

a copper pillar formed on the distribution metal layer;

a soldering ball planted on a top surface of the copper pillar; and a protective layer covering the above components with the soldering ball exposed; wherein:

the protective layer includes an upper protective layer formed on a top side of the wafer, a lower protective layer formed on a back side of the wafer, and a plurality of middle protective layers covering a portion of the edges of the semiconductor chip structure; and the upper protective layer is connected to the lower protective layer through the plurality of the middle protective layers.

16. The packaged semiconductor chip structure according to claim 15, wherein:

the passivation layer has a single layer structure including a first passivation layer; and the opening is formed in the first passivation layer.

17. The packaged semiconductor chip structure according to claim 15, wherein:

the passivation layer has a double layer structure including a first passivation layer and a second passivation layer with the second passivation layer formed on the first passivation layer;

the opening is formed by an opening in the first passivation layer and an opening in the second passivation layer; and the opening formed in the second passivation layer is on the top of the opening formed in the first passivation layer.

18. The packaged semiconductor chip structure according to claim 15, wherein:

a connection stem residue is present at an edge of the semiconductor chip structure; and the connection stem residue is covered by a middle protective layer formed in a corresponding through hole with a dimension of the through hole smaller than a dimension of the connection stem.

19. The packaged semiconductor chip structure according to claim 15, wherein:

an edge of the semiconductor chip structure is directly covered by a middle protective layer formed in a corresponding through hole with a dimension equal to a dimension of the connection stem.

* * * * *